United States Patent
Michael

[19]

[11] Patent Number: 6,018,865
[45] Date of Patent: Feb. 1, 2000

[54] METHOD FOR CALIBRATING THE Z ORIGIN POSITION

[75] Inventor: Conan J. Michael, Nampa, Id.

[73] Assignee: MCMS, Inc., Nampa, Id.

[21] Appl. No.: 09/008,944

[22] Filed: Jan. 20, 1998

[51] Int. Cl.[7] .................................................. B23P 19/00
[52] U.S. Cl. ............................................. 29/740; 29/834
[58] Field of Search ........................... 29/740, 741, 743, 29/832, 834, 836, 407.04, 593, DIG. 44; 33/1 M, 503

[56] References Cited

U.S. PATENT DOCUMENTS

| | | | |
|---|---|---|---|
| 3,950,095 | 4/1976 | Bouygues et al. | 355/72 |
| 4,794,689 | 1/1989 | Seno et al. | 29/740 |
| 4,912,884 | 4/1990 | Sigg | 51/165.75 |
| 4,972,798 | 11/1990 | Ando et al. | 118/669 |
| 5,119,759 | 6/1992 | Hicks | 118/712 |
| 5,317,814 | 6/1994 | Robler | 33/810 |
| 5,548,890 | 8/1996 | Tada et al. | 29/27 |

Primary Examiner—Lee Young
Assistant Examiner—Kevin G. Vereene
Attorney, Agent, or Firm—Craig M. Korfanta

[57] ABSTRACT

A method for calibrating the "Z" origin position of a pick and place machine including a planar element sized and configured to permit the planar element to be removably mounted on the assembly table of the machine. The "Z" origin calibration jig also includes a vertical displacement measurement device for measuring the relative vertical displacement of a part placement nozzle with relationship to a fixed elevation, typically the upper surface of the panel. In one embodiment of the invention, the vertical displacement measurement device includes a dial gauge attached to the planar element. One embodiment of the "Z" origin calibration jig includes a the planar element having a first aperture formed therein for accommodating the location of the dial portion of the dial gauge therethrough. In this embodiment the dial gauge is removably mountable within the first aperture with the dial portion of the gauge viewable at the top surface of the planar element. The feeler tip of the dial gauge extends below the bottom surface of the planar element extending through a second aperture formed through the planar element for contact with the part placement nozzle.

1 Claim, 5 Drawing Sheets

METHOD FOR CALIBRATING THE Z ORIGIN POSITION

BACKGROUND

1. Technical Field

This invention relates generally to the field of printed circuit board assembly, and more specifically, to a method and apparatus for facilitating the calibration of pick and place equipment.

2. Background of the Invention

Integrated and discrete components are commonly assembled onto printed circuit boards (PCBs) using pick and place equipment to set the various component parts on the board prior to attachment. Fuji America Corporation of Lincolnshire, Ill., as well as other manufacturers provide a variety of pick and place equipment. The present invention may be used in calibrating the "Z" origin position of a part placement nozzle relative to the height of the assembly table or some other preselected reference elevation.

Pick and place devices typically include a conveyor section which receives and transports a PCB onto an assembly table. The table is capable of movement in commonly two and occasionally in three axes. The PCB is positioned generally below the placing head.

Each placing head includes at least one part placement nozzle, which picks up a component part by employing typically a vacuum applied to the upper face of the component part. A variety of configurations exist for pick and place equipment, including multiple placing head configurations and multiple placement nozzle configurations.

In operation, a program, typically run by a processing device contained within or otherwise connected to the pick and place device, contains a series of commands which direct the pick and place device to select a nozzle by rotating a carousel head to a preselected position as well as by rotating a multiple nozzle holder to a preselected position. The program next directs the pick and place device to pick a component part from typically a number of feeder stations which dispense component parts, for example from a tape-and-reel which dispenses a particular component part at a preselected position. After the part placement nozzle has picked the component part, the placing head rotates as required to position the component part over the PCB. The assembly table is also advanced along its "X" and "Y" axes as required to position the PCB for placement of the component part. As positioning occurs, the component part is also aligned with the PCB by rotation of the placing head to orient the component part as required relative to the PCB.

The device next places the component part against the upper surface of the PCB in its preselected location, the part placement nozzle typically exerting pressure against the upper face of the component part, securing the component part against the face of the PCB. In a subsequent process step, the component part is permanently affixed to the surface of the PCB, often by heating a solder which has been previously applied to the surface of the PCB.

In a number of pick and place devices, both the carousel head and the assembly table are capable of travel in the "Z" axis. In these devices, calibration of the "Z" origin position is critical for operation, as parts which are placed with excessive pressure may be damaged and a placement employing insufficient pressure may be flawed as well. In order to calibrate a "Z" origin position for operation, a technician or other operator "locks-out" the device employing typically a key or set of keys which are inserted into a slot or slots bypassing the front safety doors of the machine. Once bypassed, the operator extends one or both arms into the machine setting the magnetic base of a dial gauge against a magnetic surface for attachment. The carousel head and the nozzle holder are both rotated to preselected positions in order to select the calibration nozzle. The operator adjusts the feeler tip of the gauge to contact the nozzle so that the feeler gauge will be responsive to the vertical travel of the nozzle. The assembly table which, for the purpose of calibration holds a calibration plate, is raised along its "Z" axis to a position where the nozzle is just touching the calibration plate. Calibration is presently achieved by setting a dial gauge within the machine's housing in a position which allows a feeler tip on the gauge to contact the nozzle for calibration. This initial position is recorded as the zero or reference point. The assembly table is raised a specified distance exerting an upward pressure against the nozzle, typically on the order of a fraction of a millimeter as measured on the dial gauge. This position is set as the "Z" origin position. The calibration tooling is removed from the machine and the machine is placed back in service employing the recently set "Z" origin position as a reference value for the downward travel of the placing head and the nozzle during operations.

It has been observed that this method is somewhat cumbersome as it requires a technician or other operator to first "lock-out" the device. Once bypassed, the operator extends one or both arms into the machine setting the dial gauge base against a magnetic surface for attachment. Next, the operator adjusts the feeler tip of the gauge to extend below the nozzle. This method exposes the operator's arms and hands to the possibility of injury within the machine. Additionally, because the dial gauge is placed manually within the machine, the assurance of test repeatability decreases. Additionally, it is difficult for the operator to assure proper alignment of the feeler tip of the gauge below the nozzle. What is needed is a method and apparatus which allows for the safe and accurate placement of the dial gauge below the part placement nozzle.

SUMMARY OF THE INVENTION

According to the present invention, a "Z" origin calibration jig may include a planar element sized and configured to permit the planar element to be removably mounted on a machine assembly table. The "Z" origin calibration jig also includes a vertical displacement measurement device having a nozzle contact member attached to the planar element for measuring the relative vertical displacement of the nozzle with relationship to a fixed elevation, typically the upper surface of the panel.

In one embodiment of the invention, the vertical displacement measurement device is a dial gauge. The dial gauge may be removably attached to the planar element. In another embodiment of the invention, the vertical displacement measurement device includes a dial gauge having attachment means which permits the dial gauge to be removably mountable on the planar element or panel.

The planar element may be configured as a panel having an upper and lower surface. The planar element may also include a first aperture formed through the cross-section of the planar element for accommodating the location of the dial gauge therethrough, although surface mounting arrangements may be achieved.

The planar element may further be configured to include a second aperture formed through the cross-section of the planar element shaped and positioned to allow the travel of the nozzle contact member through the second aperture. In this embodiment, the feeler tip of the dial gauge extends below the bottom surface of the planar element or panel, extending through the second aperture for contact with the nozzle.

The invention permits the accurate and repeatable placement of the feeler tip of the gauge below a nozzle for calibration of the "Z" origin position of the nozzle. It is also eliminates the need for the operator to physically invade the nozzle area when performing a "Z" origin position calibration.

Other advantages will become apparent to those skilled in the art from the following detailed description read in conjunction with the appended drawings and claims.

It should be understood that the referenced drawings are not to scale and are intended as representations. The drawings are not necessarily intended to depict the functional and structural details of the invention, which can be determined by one of skill in the art by examination of the descriptions and claims provided herein.

DETAILED DESCRIPTION OF THE INVENTION

Figure 1:
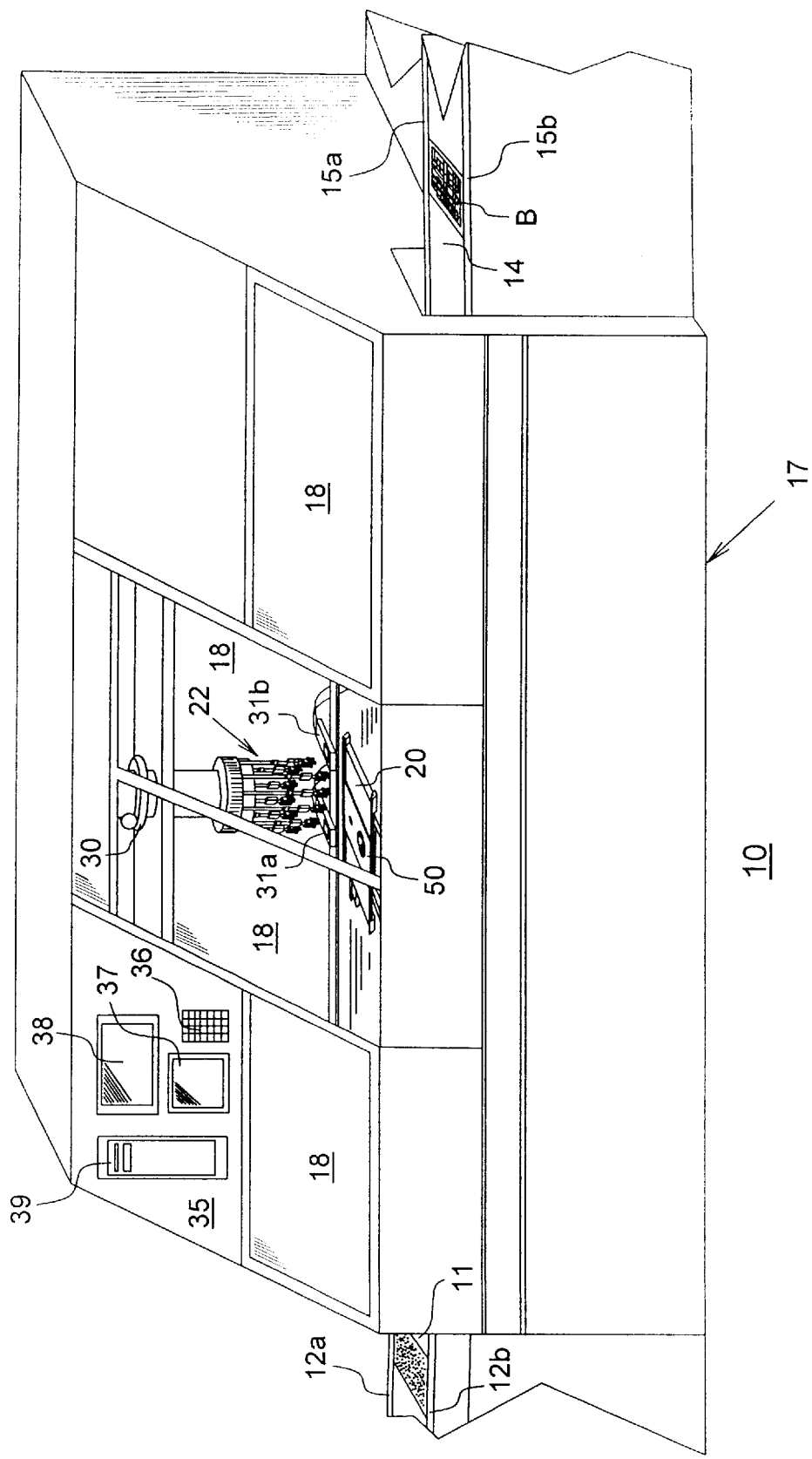
FIG. 1 is a perspective representational view of a pick and place machine.

Referring now to FIGS. 1 through 6, the present invention will be more fully described. FIG. 1 is a perspective representational view of a semiconductor pick and place machine illustrated generally at 10. Pick and place machine 10 is typically located in sequence with a number of semiconductor device fabrication machines which perform a variety of manufacturing processes. Pick and place machine 10 may typically include "in" conveyor section 11, including first conveyor rail 12a and second conveyor rail 12b, for on-loading parts into pick and place machine 10. Pick and place machine 10 also typically includes "out" conveyor 14 having first conveyor rail 15a and second conveyor rail 15b.

Figure 2:
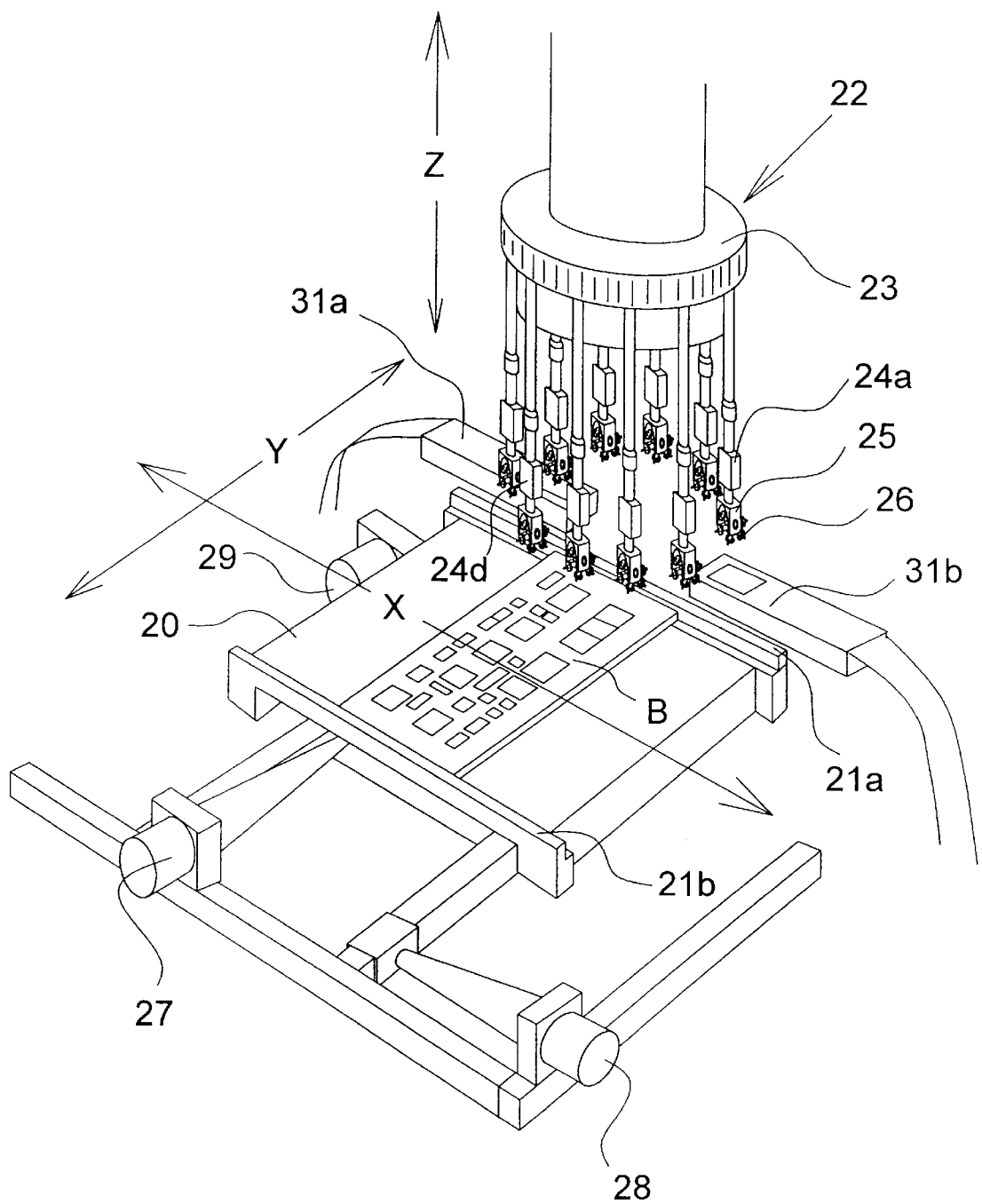
FIG. 2 is a perspective representational view of a nozzle carousel positioned over an assembly table holding a printed circuit board.
Figure 3:
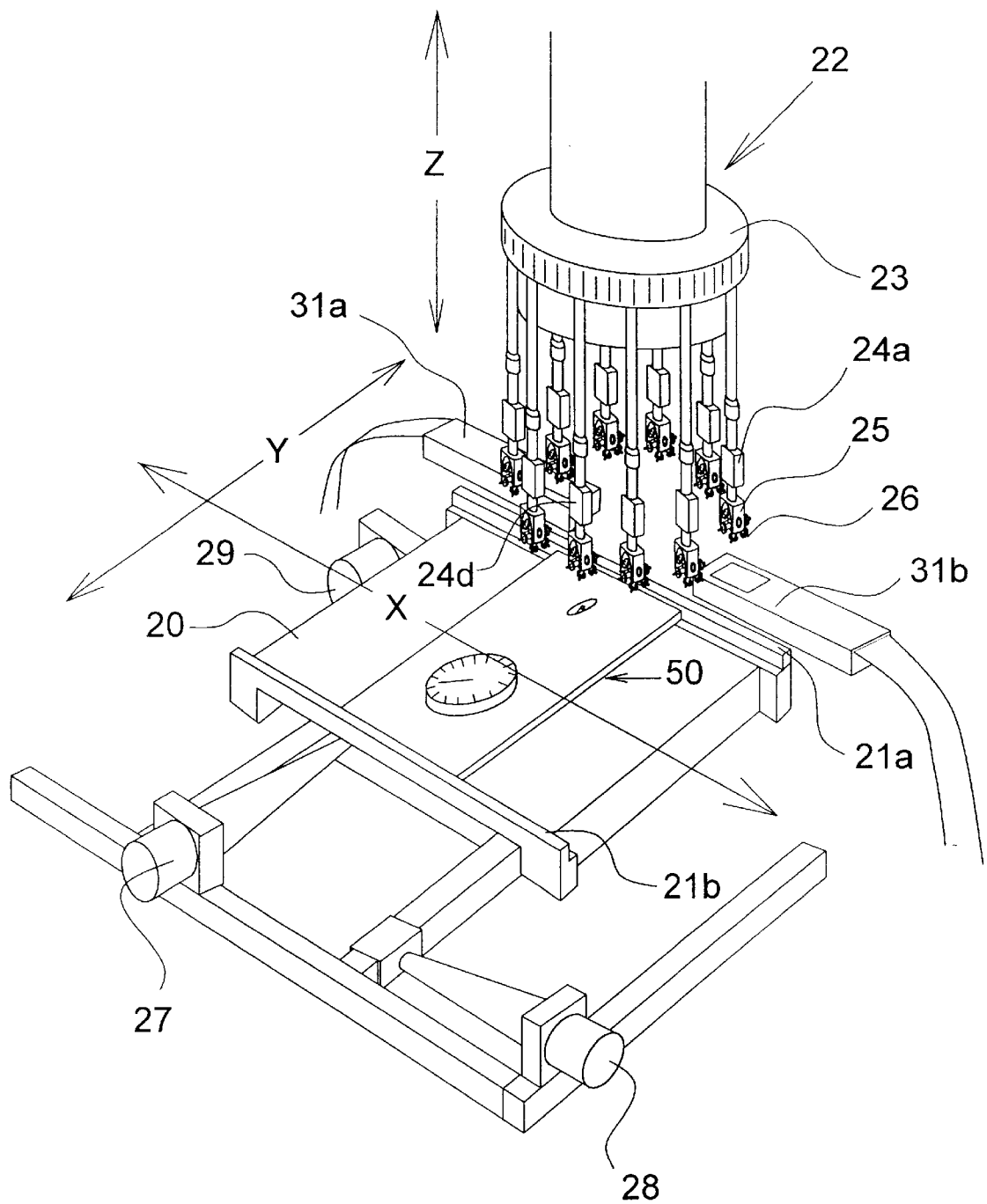
FIG. 3 is a perspective representational view of a nozzle carousel positioned over an assembly table holding a "Z" origin calibration jig.

FIG. 1 also illustrates pick and place machine 10 including machine housing 17 having windows 18, which enclose the operative components of pick and place machine 10. As shown in FIG. 1, pick and place machine 10 also includes assembly table 20. As shown in FIGS. 2 and 3, assembly table 20 includes first assembly table rail 21a and second assembly table rail 21b. Assembly table 20 moves forward and backward along its "Y" axis from a first position where printed circuit board B is loaded between first assembly table rail 21a and second assembly table rail 21b to a second position where assembly table 20 is positioned generally below placing head 22. Assembly table 20 is also movable laterally along its "X" axis permitting location of printed circuit board B below placing head 22. Assembly table 20 is driven in the "X" direction by X table drive 27. Assembly table 20 is driven in the "Y" direction by Y table drive 28. Assembly table 20 is driven along the "Z" axis by "Z" table drive 29.

Referring to FIGS. 2 and 3, placing head 22 includes carousel head 23 which may include a plurality of individual nozzle heads, nozzle heads 24a and 24d being specifically called out. Each nozzle head includes a rotating nozzle holder 25 which holds a plurality of nozzles 26. Placing head 22 is rotatable about the "Z" axis by θ head servo motor 30, depicted in FIG. 1, to permit positioning of placing head 22 over a variety of stations depending upon the given function being performed. In addition, each nozzle head 24 is movable vertically along the "Z" axis by a cam actuated solenoid (not shown) to permit picking and placing functions.

Placing head 22 is rotatable to permit positioning of any of the nozzle heads over feeder stations 31a, feeder station 31b or assembly table 20. A tape-and-reel feeder (not shown) provides a source for component parts delivered at the feeder stations.

Referring again to FIG. 1, an operation panel shown generally as 35 may include a keypad 36 for controlling the various functions of pick and place machine 10, camera screen 37 for monitoring placing head 22 travel and component part placement, monitor 38 for viewing pick and place machine 10 status and control information and CPU 39 for processing operation programs and data. Referring to FIG. 2, in operation, and depending upon the program being executed by pick and place machine 10, placing head 22 rotates positioning nozzle head 24a over a feeder station 31a. Nozzle head 24a extends along the "Z" axis picking a component part from feeder station 31a. Simultaneously, assembly table 20 positions along its "X" and "Y" axes, positioning printed circuit board B for the next sequential part placement. Next, nozzle head 24d extends to the limit of its travel along its "Z" axis. Assembly table 20 is then raised along the "Z" axis as required by the program being executed and the particular part being placed to achieve surface mounting of the part on printed circuit board B.

Figure 5:
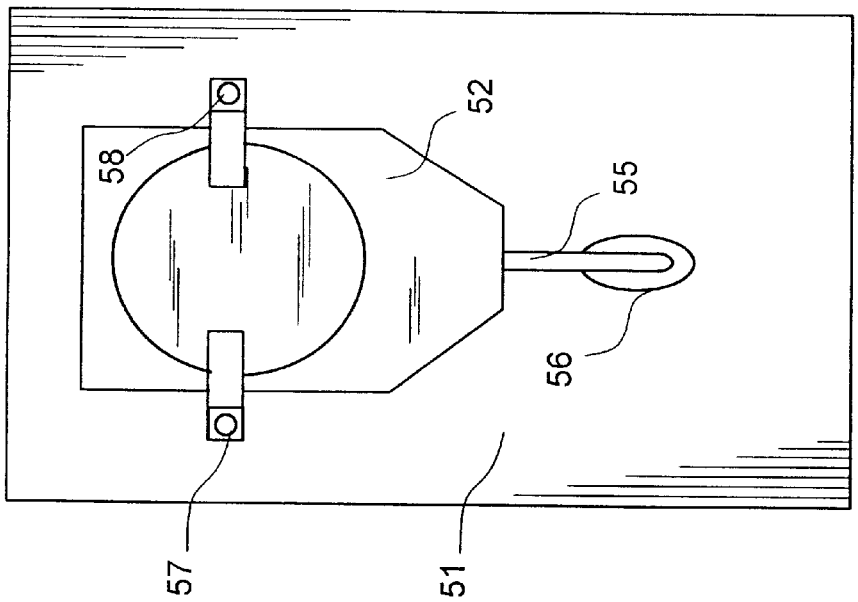
FIG. 5 is a bottom view of one embodiment of the "Z" origin calibration jig.
Figure 4:
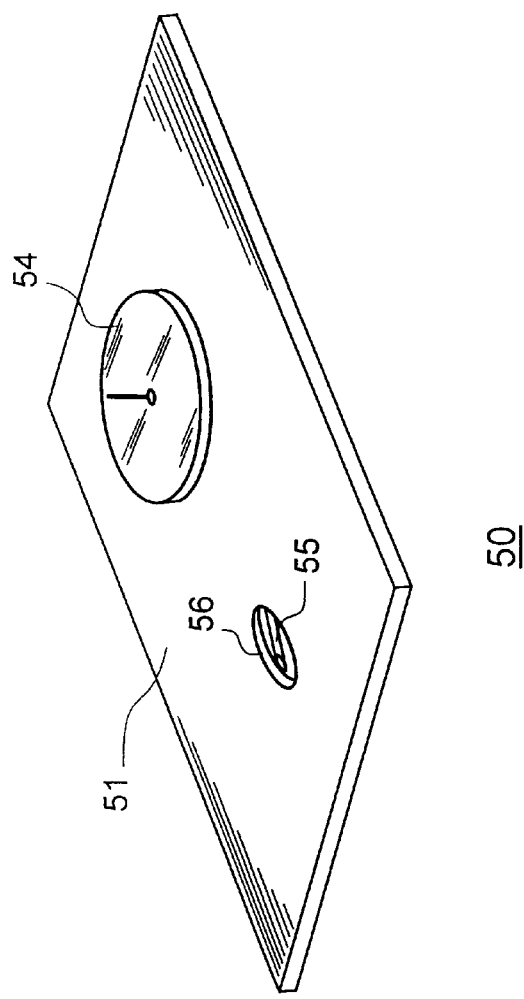
FIG. 4 is a perspective representational view of one embodiment of the "Z" origin calibration jig.
Figure 6:
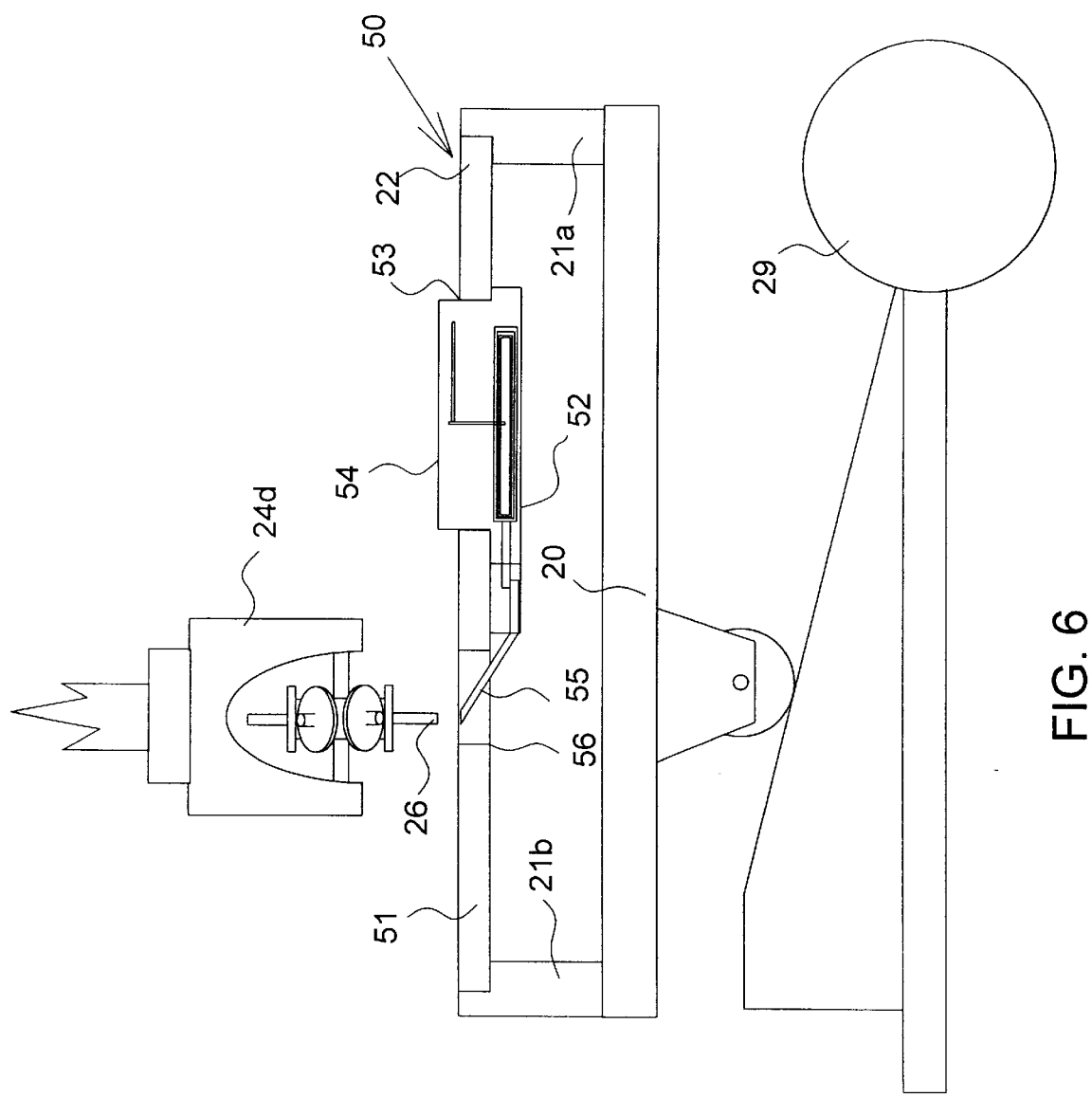
FIG. 6 is a sectional detail view of one embodiment of the "Z" origin calibration jig.

Referring to FIGS. 4, 5 and 6, "Z" origin calibration jig 50 includes a planar element shown as panel 51 sized and configured to be removably mounted on assembly table 20. Referring to FIG. 6, panel 51 is configured having an upper and lower surface. "Z" origin calibration jig 50 also includes a vertical displacement measurement device including a nozzle contact member, which in the embodiment depicted in FIGS. 4 through 6, includes dial gauge 52. As shown in FIG. 5, dial gauge 52 is removably secured in position by first swivel dog 57 and second swivel dog 58. Dial gauge 52 also includes feeler tip 55 which, as shown in FIG. 6, extends from dial gauge 52 below panel 51 extending through second aperture 56. Dial gauge 52 also includes dial portion 54 which is viewable from the top surface of panel 51. This configuration permits the measurement of the relative vertical displacement between the tip of nozzle 26 and a reference elevation, determined by a "zero" reading on dial portion 54 when the tip of nozzle 26 first contacts feeler tip 55.

In the embodiment of "Z" origin calibration jig 50, shown in FIG. 6, the attachment includes first aperture 53 formed through the cross section of panel 51 which is sized and configured to permit the location of dial portion 54 of dial gauge 52 therethrough. In the embodiment depicted in FIG. 6, dial portion 54 of dial gauge 52 is removably mountable within first aperture 53. Feeler tip 55 of dial gauge 52 extends below the bottom surface of panel 51 extending through second aperture 56. Second aperture 56 is formed through the cross section of panel 51 and is sized and configured to permit the unimpeded travel of feeler tip 55 therethrough.

Referring to FIGS. 1, 3 and 6, the "Z" axis position origin is calibrated and adjusted by first switching pick and place machine 10 into a test mode by entering the proper command at keypad 36. Once in the test mode "Z" origin calibration jig 50 is placed on assembly table 20 and secured between rails 21a and 21b so that second aperture 56 is positioned below a preselected nozzle shown as nozzle 26 in FIG. 6. Nozzle 26 is positioned at a preselected elevation by jogging the cam actuated solenoid to a preselected downward position along the "Z" axis, typically, the extent of the nozzle's downward travel along the "Z" axis. Assembly table 20 is then raised along the "Z" axis by operation of "Z" table drive 29 until nozzle 26 contacts feeler tip 55 of dial gauge 52. Dial portion 54 is adjusted so that a zero reading is obtained at this point Next, assembly table is again raised along the "Z" axis by operation of "Z" table drive 29 until nozzle 26 depresses feeler tip 55 of dial gauge 52 a preselected distance. The "Z" axis position origin is now set. Following this procedure, pick and place machine 10 may be returned to the operational mode by entering the proper command at keypad 36.

A method of monitoring a "Z" axis position origin in a pick and place machine generally comprises the acts of:

placing a "Z" origin calibration jig including a vertical displacement measurement device having a nozzle contact member on an assembly table of the pick and place machine;

positioning a preselected nozzle of the pick and place machine at a preselected elevation above the vertical displacement measurement device nozzle contact member so that the nozzle contacts the vertical displacement measurement device nozzle contact member; and raising the assembly table along the "Z" axis a preselected distance.

While this invention has been described with reference to the described embodiments, this is not meant to be construed in a limiting sense. Various modifications to the described embodiments, as well as additional embodiments of the invention, will be apparent to persons skilled in the art upon reference to this description, the drawings and the appended claims. It is therefore contemplated that the appended claims will cover any such modifications or embodiments as fall within the true scope of the invention.

I claim:

1. A method for calibrating a "Z" axis position origin in a pick and place machine comprising:

placing a calibration jig including a planar element and a vertical displacement measurement device attached to the planar element, the vertical displacement measurement device having a nozzle contact member, on an assembly table of the pick and place machine;

positioning a preselected nozzle of the pick and place machine at a preselected elevation above the vertical displacement measurement device nozzle contact member so that the nozzle contacts the vertical displacement measurement device nozzle contact member; and raising the assembly table along the "Z" axis a preselected distance.

* * * * *

UNITED STATES PATENT AND TRADEMARK OFFICE
CERTIFICATE OF CORRECTION

PATENT NO. : 6,018,865
DATED : 02/01/2000
INVENTOR(S) : CONAN, Michael J.

It is certified that error appears in the above-identified patent and that said Letters Patent are hereby corrected as shown below:

The inventor's name is shown incorrectly as Conan J. Michael.

The corection should show Michael J. Conan.

Signed and Sealed this

Third Day of April, 2001

Attest:

NICHOLAS P. GODICI

*Attesting Officer*    Acting Director of the United States Patent and Trademark Office